United States Patent
Yoo et al.

(10) Patent No.: US 8,221,176 B2
(45) Date of Patent: Jul. 17, 2012

(54) ORGANIC LIGHT EMITTING DIODE DEVICE

(75) Inventors: Choong Keun Yoo, Incheon (KR); Jeong Hyun Kim, Gunpo-si (KR)

(73) Assignee: LG Display Co., Ltd., Seoul (KR)

( * ) Notice: Subject to any disclaimer, the term of this patent is extended or adjusted under 35 U.S.C. 154(b) by 151 days.

(21) Appl. No.: 12/905,808

(22) Filed: Oct. 15, 2010

(65) Prior Publication Data

US 2011/0033960 A1 Feb. 10, 2011

Related U.S. Application Data

(62) Division of application No. 12/004,066, filed on Dec. 20, 2007, now Pat. No. 7,830,083.

(30) Foreign Application Priority Data

Dec. 22, 2006 (KR) .................. 10-2006-0132308

(51) Int. Cl.
*H01J 9/00* (2006.01)
(52) U.S. Cl. .......................................................... 445/23
(58) Field of Classification Search .............. 445/23–25; 313/498–512
See application file for complete search history.

(56) References Cited

U.S. PATENT DOCUMENTS 5,306,572 A    4/1994    Ohashi et al.

*Primary Examiner* — Joseph L Williams
(74) *Attorney, Agent, or Firm* — McKenna Long & Aldridge LLP

(57) ABSTRACT

An organic light emitting diode (OLED) device according to the present invention includes a first substrate; a first electrode on the first substrate in the pixel region, the first electrode formed of a metal; an organic light-emitting layer on the first electrode; a second electrode on the organic light-emitting layer, the second electrode formed of a transparent conductive material; and a transparent layer on the second electrode, the transparent layer including an inorganic material or a semiconductor material.

9 Claims, 5 Drawing Sheets

ORGANIC LIGHT EMITTING DIODE DEVICE

This application is a divisional application of application Ser. No. 12/004,066, filed Dec. 20, 2007 now U.S. Pat. No. 7,830,083 and claims the benefit of Korean Patent Application No. 10-2006-132308, filed Dec. 22, 2006, which are hereby incorporated by reference for all purposes as if fully set forth herein.

BACKGROUND OF THE INVENTION

1. Field of the Invention

The present invention relates to an organic light emitting diode (OLED) device, and more particularly, to an organic light emitting diode (OLED) device with an improved color realization ratio.

2. Discussion of the Related Art

With the development of the information society, demands for various display devices increase. Accordingly, many efforts have been made to research and develop various flat display devices, such as liquid crystal display (LCD) devices, plasma display panels (PDP) and vacuum fluorescent display (VFD) devices, and some of them are already applied to displays of various equipment.

Among the flat display devices, organic light emitting diode (OLED) devices are self-luminous. Unlike LCD devices that can not emit light by themselves, OLED devices have no backlight unit because OLED devices are self-luminous display devices. In this respect, OLED devices can realize thin profile and lightweight. Also, OLED devices are suitable for mobile electronic equipment owing to the advantageous properties of high color purity, low power consumption and low driving voltage. In addition, OLED devices have rapid response speed and can be used in a wide temperature range. Especially, OLED devices can be manufactured at a low cost.

OLED devices have a fluorescent or phosphorescent organic-compound thin film. OLED devices emit light by the coupling of electrons and holes in the organic-compound thin film so that OLED devices realize a high picture quality and wide viewing angle as self-luminous devices.

A typical OLED device is provided with pixels arranged in a matrix to display images. Each pixel includes a light-emitting cell and a cell-driving part to drive the light-emitting cell independently. The light-emitting cell includes a pixel electrode connected with the cell-driving part, a common cathode connected with the ground, and a light-emitting part formed between the pixel electrode and the common cathode. The cell-driving part includes a gate line to which a scan signal is supplied, a data line to which a video data signal is supplied, a power-supplying line to which a common driving voltage is supplied, and two transistors and one storage capacitor connected between the data line and the power-supplying line.

An organic light-emitting diode (OLED) device according to the related art will now be described. FIG. 1 is a schematic view briefly illustrating an OLED device according to the related art.

The OLED device includes a substrate 16 having a metal layer 17, an organic light-emitting layer 14 formed on the metal layer 17, a transparent conductive layer 12 formed on the organic light-emitting layer 14, and a transparent substrate 10 formed on the transparent conductive layer 12. The metal layer 17 on the substrate 16 has a light-shielding function. Also, the light emitted from the organic light-emitting layer 14 progresses upward, and then passes through the transparent substrate 10, thereby representing colors. The organic light-emitting layer 14 includes a first organic light-emitting layer 14a to represent a red color, a second organic light-emitting layer 14b to represent a green color, and a third organic light-emitting layer 14c to represent a blue color.

In the case of an LCD device, white light is provided from a backlight unit positioned under an LCD panel, and some wavelengths of the white light are transmitted through a color filter layer of an upper substrate, whereby images are displayed on a screen. Meanwhile, the OLED device, as a self-luminous display device, directly emits red, green and blue lights from the organic light-emitting layers of the respective pixels, and the color purity of the lights are determined by the material characteristics of the light emitting layer of the pixels. In particular, the purity of the blue color is low compared to other colors in OLED devices.

Accordingly, the OLED device according to the related art has a problem of a low color realization ratio. In other words, the OLED device according to the related art may not represent all desired colors due to the low color purity of the lights generated from the organic light-emitting layers. Recently, continuous efforts are being made to display images with an improved color realization ratio.

SUMMARY OF THE INVENTION

Accordingly, the present invention is directed to an organic light emitting diode (OLED) device and a manufacturing method thereof that substantially obviate one or more problems due to limitations and disadvantages of the related art.

An advantage of the present invention is to provide an OLED device with an improved color realization ratio and a manufacturing method thereof.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the invention, as embodied and broadly described herein, an organic light emitting diode (OLED) device having a plurality of pixel regions, each pixel region includes a first substrate; a first electrode on the first substrate in the pixel region, the first electrode formed of a metal; an organic light-emitting layer on the first electrode; a second electrode on the organic light-emitting layer, the second electrode formed of a transparent conductive material; and a transparent layer on the second electrode, the transparent layer including an inorganic material or a semiconductor material.

In another aspect of the present invention, an organic light emitting diode (OLED) device having a plurality of pixel regions, each pixel region includes a first substrate; a first electrode on the first substrate in the pixel region, the first electrode formed of a metal; an organic light-emitting layer on the first electrode; a second electrode on the organic light-emitting layer, the second electrode formed of a transparent conductive material; a transparent layer on the first electrode, the transparent layer including an inorganic material or a semiconductor material; and a thin film transistor on a second substrate, the thin film transistor being electrically connected to the second electrode.

In yet another aspect of the present invention, a method for manufacturing an organic light emitting diode (OLED) device having a plurality of pixel regions, the method includes preparing a substrate; forming a first electrode on the substrate; forming an organic light-emitting layer on the first electrode; forming a second electrode on the organic light-emitting layer; and forming a transparent layer on the second electrode, the transparent layer including an inorganic material or a semiconductor material.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

An organic light emitting diode (OLED) device according to a first embodiment of the present invention will now be described with reference to the accompanying drawings.

Figure 1:
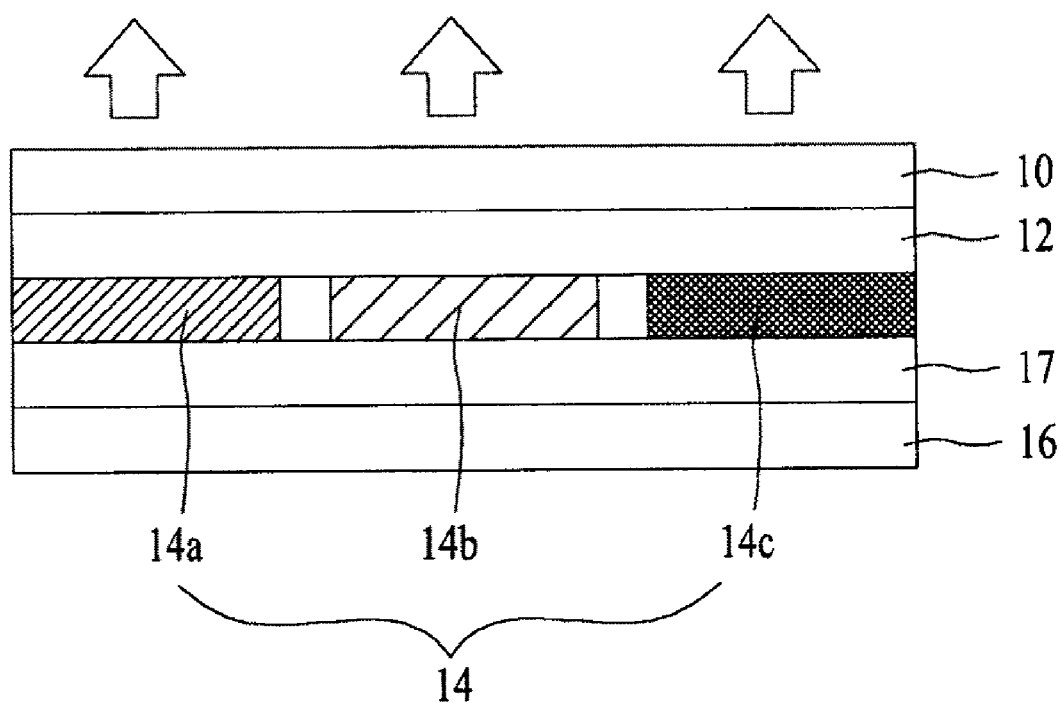
FIG. 1 is a schematic view briefly illustrating an organic light emitting diode (OLED) device according to the related art.
Figure 2:
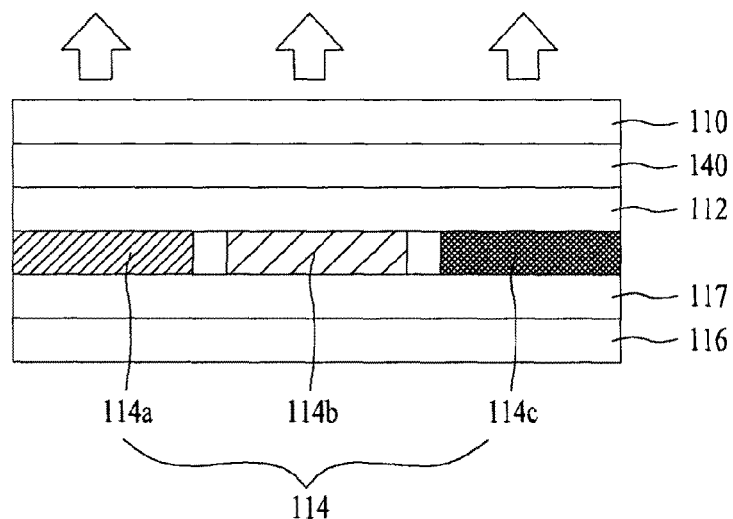
FIG. 2 is a schematic view briefly illustrating an OLED device according to the first embodiment of the present invention.
Figure 3:
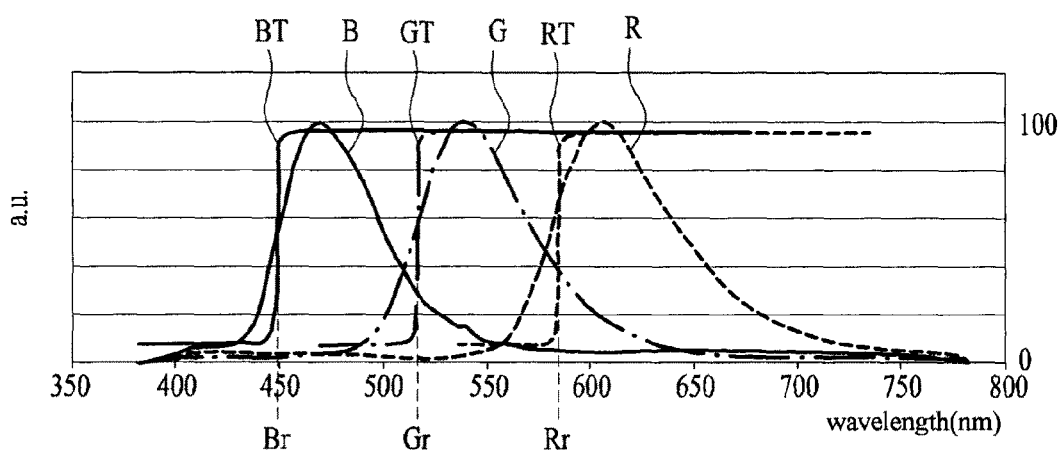
FIG. 3 is a graph showing a transmittance ratio of a transparent inorganic layer according to the present invention.

FIG. 2 is a schematic view briefly illustrating an OLED device according to the first embodiment of the present invention. FIG. 3 is a cross-sectional view illustrating the OLED device according to the first embodiment of the present invention in detail.

Referring to FIG. 2, the OLED device includes a substrate 116 having a metal layer 117, an organic light-emitting layer 114 on the metal layer 117, a transparent conductive layer 112 on the organic light-emitting layer 114, a transparent inorganic layer 140 on the transparent conductive layer 112, and a transparent substrate 110 on the transparent inorganic layer 140.

The light emitted from the organic light-emitting layer 114 progresses upward, and then passes through the transparent substrate 110, thereby representing colors. Also, the light emitted from the organic light-emitting layer 114 and reflected on the metal layer 117 of the substrate 116 also passes through the transparent substrate 110, thereby representing colors.

The organic light-emitting layer 114 includes a first organic light-emitting layer 114a to represent a red color (R), a second organic light-emitting layer 114b to represent a green color (G), and a third organic light-emitting layer 114c to represent a blue color (B). The first, second and third organic light-emitting layers 114a, 114b and 114c are arranged in a matrix.

The transparent conductive layer 112 is formed of, for example, Indium Tin Oxide (ITO), Indium Zinc Oxide (IZO) or Indium Tin Zinc Oxide (ITZO) that can transmit light. In order to control the color realization ratio for each color, the transparent conductive layer 112 may be provided with different thicknesses in the respective first, second and third organic light-emitting layers 114a, 114b and 114c.

The transparent inorganic layer 140 of silicon nitride ($SiN_x$) is formed on an entire surface of the transparent conductive layer 112, with a thickness between 1500 Å and 3500 Å. The transparent inorganic layer 140 may be formed of silicon oxide ($SiO_2$) or amorphous silicon (a-Si). The transparent inorganic layer 140 may also be formed with a thickness between 300 Å and 1 μm. The transparent inorganic layer 140 may have a single or multi-layered structure. Also, the transparent inorganic layer 140 may be formed in an island shape on the respective first, second and third organic light-emitting layers 114a, 114b and 114c, or may be formed along a column or row on the organic light-emitting layer 114 in a bar or mesh shape. The transparent inorganic layer 140 may be provided with different thicknesses in the respective first, second and third organic light-emitting layers 114a, 114b and 114c.

Through the control on at least one of the thickness and the material, the transparent inorganic layer 140 excludes a wavelength range of low transmittance from R, G and B lights, and selectively filters a wavelength range of high transmittance. For example, as shown in FIG. 3, if the transparent inorganic layer 140 with a first thickness shows the property of first transmittance BT, the transparent inorganic layer 140 with the first thickness excludes the wavelength range which is lower than a predetermined wavelength Br of the B right, and transmits the wavelength range which is higher than the predetermined wavelength Br, whereby B light has the improved color purity. If the transparent inorganic layer 140 has a second thickness which is larger than the first thickness, and shows the property of second transmittance GT, the transparent inorganic layer 140 with the second thickness excludes the wavelength range which is lower than a predetermined wavelength Gr of the G light, and transmits the wavelength range which is higher than the predetermined wavelength Gr, whereby G light has the improved color purity. If the transparent inorganic layer 140 has a third thickness which is larger than the second thickness, and shows the property of third transmittance RT, the transparent inorganic layer 140 with the third thickness excludes the wavelength range which is lower than a predetermined wavelength Rr of the R right, and transmits the wavelength which is higher than the predetermined wavelength Rr, whereby R light has the improved color purity. Accordingly, for example, if the transparent inorganic layer 140 is provided with the first thickness between 1500 Å and 3500 Å, it is possible to improve the color purity of B light which has the lowest color purity in OLED. Meanwhile, if the transparent inorganic layer 140 is provided with the first to third thicknesses of the different values corresponding to the first to third organic light-emitting layers 114a, 114b and 114c, R, G and B lights have the improved color purity.

In comparison to the OLED device according to the related art, the OLED device according to the first embodiment of the present invention may improve the blue color realization ratio, with human eyes being relatively more sensitive to the blue color than the red and green colors.

Figure 4:
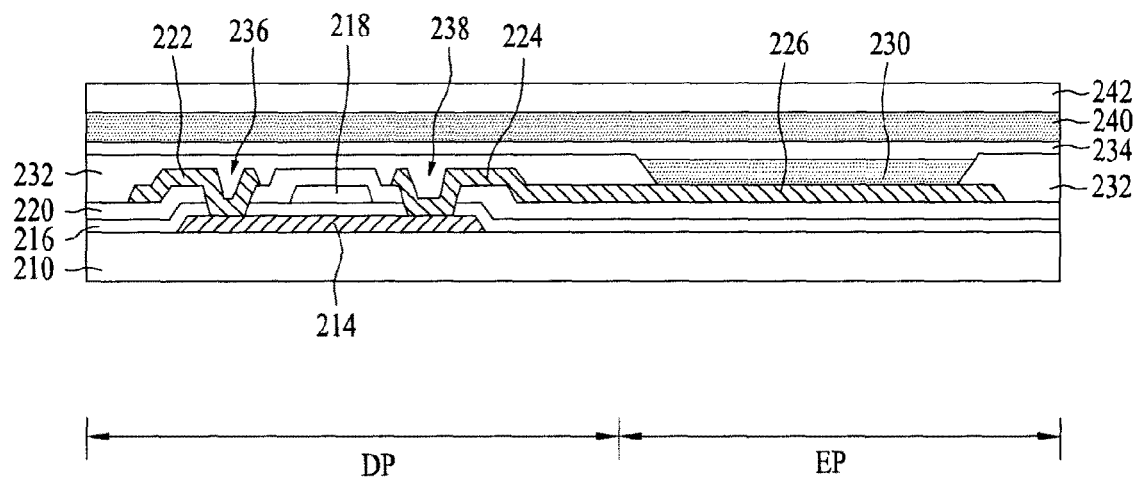
FIG. 4 is a cross-sectional view illustrating an OLED device according to the first embodiment of the present invention.

Referring to FIG. 4, the OLED device according to the first embodiment of the present invention includes a first substrate 210 defined with a driving part (DP) and a light-emitting part (EP) in each sub-pixel, a thin film transistor formed in the driving part (DP) of the first substrate 210, a first electrode 226 formed on the light-emitting part (EP) of a insulating interlayer 220 and electrically connected with the thin film transistor, an organic light-emitting layer 230 formed on the first electrode 226, a second electrode 234 formed on the organic light-emitting layer 230, a transparent inorganic layer 240 formed on the second electrode 234 and a second substrate 242 formed on the transparent inorganic layer 240.

The thin film transistor provided in the driving part (DP) includes a semiconductor layer 214 formed as an LTPS (Low Temperature Poly-Silicon) thin film on the first substrate 210, a gate insulation film 216 to cover the semiconductor layer 214, a gate electrode 218 formed on the gate insulation film 216, an insulating interlayer 220 to cover the gate electrode 218, and source and drain electrodes 222 and 224 connected with the semiconductor layer 214 via first and second contact holes 236 and 238 passing through the gate insulation film 216 and the insulating interlayer 220, respectively. A buffer layer may be formed between the semiconductor 214 and the first substrate 210. The first electrode 226 is formed on the insulating interlayer 220, by extending from the drain electrode 224. The first electrode 226 and the drain electrode 224 are formed of the same metal at the same time. The first electrode 226 of a light-shielding metal reflects the incidence light emitted from the organic light-emitting layer 230 into the second electrode 234.

A bank insulation layer 232 is formed on the first substrate 210 including the thin film transistor and the first electrode 226 connected with the drain electrode 224, wherein the bank insulation layer 232 is provided with a hole to expose an upper side of the first electrode 226.

The organic light-emitting layer 230 is formed on the first electrode 226 in a matrix to emit red, green and blue lights to the respective sub-pixels.

The second electrode 234 is formed on the organic light-emitting layer 230 and the bank insulation layer 232. The second electrode 234 is formed of a transparent conductive material, for example, Indium Tin Oxide (ITO), Indium Zinc Oxide (IZO) or Indium Tin Zinc Oxide (ITZO) that can transmit light. In order to control the color realization ratio for each color, the transparent conductive layer 112 may be provided with different thicknesses on the organic light-emitting layer 230 of each sub pixel.

The transparent inorganic layer 240 on the second electrode 234 is formed of silicon nitride ($SiN_x$) with a thickness between 1500 Å and 3500 Å, but it is not limited to this structure. The transparent inorganic layer 240 may be formed of silicon oxide ($SiO_2$) or amorphous silicon (a-Si), and the transparent inorganic layer 240 may be provided with a thickness between 300 Å and 1 μm. The transparent inorganic layer 240 may be formed by depositing at least one of the inorganic material including silicon nitride ($SiN_x$), silicon oxide ($SiO_2$) and amorphous silicon (a-Si). The transparent inorganic layer 240 is formed with a constant thickness on the entire surface of the transparent substrate 210 in this embodiment, but it is not limited to this structure. The transparent inorganic layer 240 may is formed in a single layered structure, or a multi-layered structure including at least two difference materials of the above inorganic materials. Also, the transparent inorganic layer 240 may be formed by depositing and patterning the inorganic material. The transparent inorganic layer 240 may be provided with different thicknesses in the respective organic light-emitting layers 230 to emit the red, green and blue lights. The transparent inorganic layer 240 may be formed on the organic light-emitting layer 230 of each sub-pixel in an island shape, or may be formed along a column or row on the organic light-emitting layer in a bar shape.

Then, the second transparent substrate 242 is formed on the transparent inorganic layer 240. The light emitted from the organic light-emitting layer 230 passes through the second electrode 234, the transparent inorganic layer 240 and the second transparent substrate 242 to represent a color. The light being incident on the first electrode 226 is reflected into the second electrode 234.

An OLED device according to a second embodiment of the present invention will now be explained with reference to FIG. 5

Figure 5:
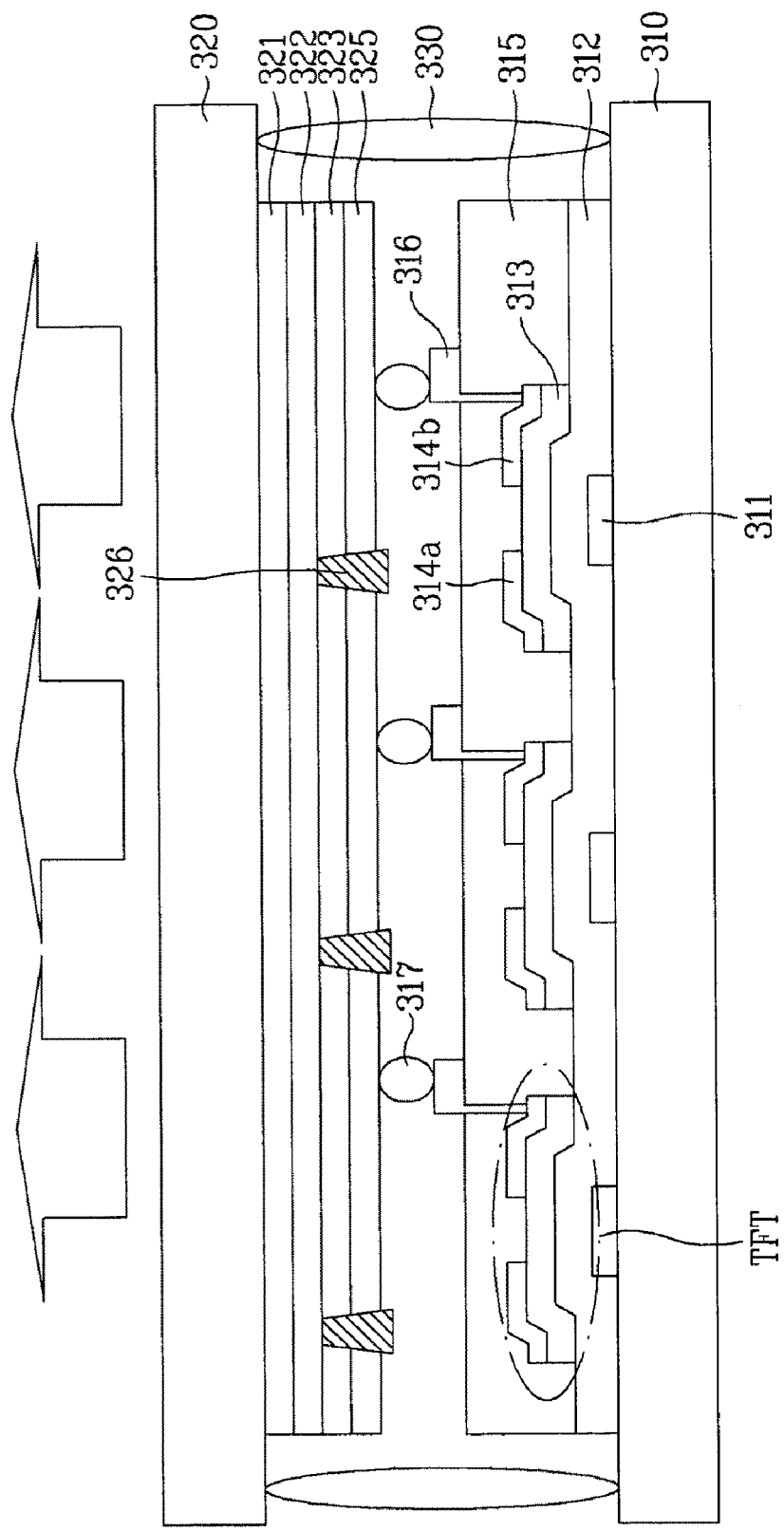
FIG. 5 is a cross-sectional view illustrating an OLED device according to the second embodiment of the present invention.

Referring to FIG. 5, the OLED device includes a first substrate 310, a second substrate 320, a thin film transistor array including a thin film transistor (TFT) in each of sub-pixels on the first substrate 310, a transparent inorganic layer 321 formed on the second substrate 320, a first electrode 322 formed on the transparent inorganic layer 321, an organic light-emitting layer 323 formed on the first electrode 321, a second electrode 325 formed on the organic light-emitting layer 323, a seal pattern 330 formed at a periphery of the first and second substrates 310 and 320, and a wall 326 to divide the sub-pixels. To supply currents to the organic light-emitting layer 323, there are a conductive spacer 317 and a connection electrode 316 that connect the second electrode 325 with the thin film transistor (TFT) in each sub-pixel.

When the thin film transistor (TFT) array is arranged on the first substrate 310 and the organic light-emitting layer 323 is formed on the second substrate 320, it is referred to as a dual-plate OLED (DOD) device.

The transparent inorganic layer 321 may be formed of at least one of an inorganic material including silicon nitride ($SiN_x$), silicon oxide ($SiO_2$) and amorphous silicon (a-Si). The transparent inorganic layer 321 may is formed in single layer, or multi layers including at least two difference material of the above inorganic material.

The first electrode 322 is formed on an entire surface of the transparent inorganic layer 321. The first electrode 322 is transparent electrode.

The wall 326 on the first electrode 322 is formed of an organic material and to have both side surfaces of inverse taper. The wall 326 divides the organic light-emitting layer 323 and the second electrode 325 with each sub pixel.

The organic light-emitting layer 323 includes a first carrier-transporting layer, a light-emitting layer and a second carrier-transporting layer formed in sequence, wherein the first and second carrier-transporting layers inject and transport electrons or holes to the light-emitting layer 323. The first and second carrier-transporting layers are determined based on the arrangement structure of the anode and cathode. For example, when the light-emitting layer is selected from one of high molecular substances, the first electrode 322 is the anode and the second electrode 325 is the cathode. In such a case, the first carrier-transporting layer adjacent to the first electrode 322 is formed by sequentially depositing a hole injection layer and a hole transporting layer, and the second carrier-transporting layer adjacent to the second electrode 325 is formed by sequentially depositing an electron injection layer and an electron transporting layer.

Also, the first and second carrier-transporting layers and the light-emitting layer may be formed of a high molecular substance or low molecular substance. When they are formed of a low molecular substance, a vacuum deposition method is used to form such layers. Meanwhile, when they are formed of a high molecular substance, an inkjet method may be used to form such layers.

Unlike a spacer included in a general LCD device, the conductive spacer 317 accomplishes the functions of an electric connection and a cell-gap maintenance between the two substrates 310 and 320. The conductive spacer 317 has a predetermined height, with a predetermined cubic shape between the two substrates 310 and 320.

The thin film transistor (TFT) corresponds to a driving thin film transistor that is electrically connected with the organic light-emitting layer 323, as different from a switching thin film transistor. The thin film transistor (TFT) includes a gate electrode 311 formed on a predetermined portion of the first substrate 310, a semiconductor layer 313 formed in a shape of an island to cover the gate electrode 311, and source and drain electrodes 314a and 314b formed at both sides of the semiconductor layer 313. The gate insulation film 312 is formed on an entire surface of the first substrate 310 between the gate electrode 311 and the semiconductor layer 313. Then, a passivation layer 315 is formed on the gate insulation film 312 including the source and drain electrodes 314a and 314b. The drain electrode 314b is electrically connected with the connection electrode 316 formed on the passivation layer 315 through a hole in the passivation layer 315. The upper side of the connection electrode 316 is in contact with the conductive spacer 317. The connection electrode 316 and the drain electrode 314b are formed of the same metal at the same time.

The conductive spacer 317 electrically connects the drain electrode 314b of the thin film transistor (TFT) formed in each of the sub-pixels of the first substrate 310 with the second electrode 325 of the second substrate 320. The conductive spacer 317 is formed by coating metal on a column-shaped spacer of an inorganic insulation material. The conductive spacer 317 connects the sub-pixels of the first and second substrates 310 and 320 in a one-to-one correspondence, so that currents can flow therethrough. The metal coated on an outer surface of the conductive spacer 317 is selected from conductive materials. Beneficially, the conductive spacer 317 is formed of a metal having a softness and low resistivity.

The first electrode 322 is formed of a transparent conductive material, and the second electrode 325 is formed of a light-shielding metal. Also, the space provided between the first and second substrates 310 and 320 may be filled with an inert gas or insulating liquid.

Figure 6:
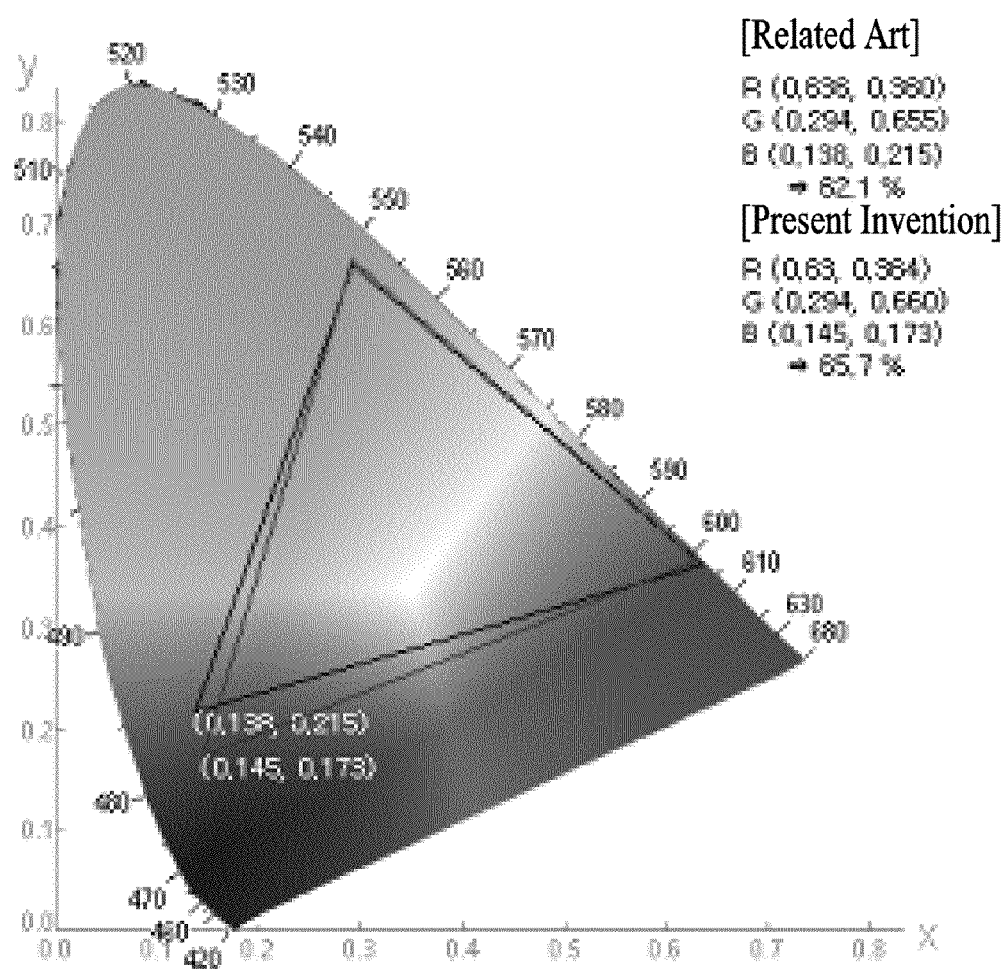
FIG. 6 is a graph showing a color realization ratio in an OLED device according to the present invention.

The color realization ratio of an OLED device according to the present invention will now be discussed. The OLED device according to the present invention has a transparent inorganic layer of silicon nitride ($SiN_x$) with a thickness in a range of 1500 Å and 3500 Å. Tables 1 and 2, and FIG. 6 illustrate the color realization ratio of the OLED device according to the present invention, as compared with the OLED device according to the related art.

TABLE 1

|  | CIE x | CIE y | Color realization ratio |
|---|---|---|---|
| Red | 0.636 | 0.360 | 62% |
| Green | 0.294 | 0.655 |  |
| Blue | 0.138 | 0.215 |  |

TABLE 2

|  | CIE x | CIE y | Color realization ratio |
|---|---|---|---|
| Red | 0.630 | 0.364 | 66% |
| Green | 0.294 | 0.660 |  |
| Blue | 0.145 | 0.173 |  |

The results shown in Tables 1 and 2 correspond to color coordinates based on a standard colorimetric system established in 1960 by Commission Internationale de l'Eclairage (CIE).

Referring to FIG. 6, the X and Y color coordinates of the red and green colors of the OLED device according to the related art are similar to those of the OLED device according to the present invention. However, the color realization ratio of the OLED device according to the present invention is higher than that of the OLED device according to the related art, because the X and Y color coordinates of the blue color is moved. That is, the area of the triangle of the OLED device according to the present invention is larger than that of the OLED device according the related art, which means that a larger number of colors may be represented.

Referring to Tables 1 and 2, the color realization ratio of the OLED device according to the related art is 62%, while the color realization ratio of the OLED device according to the present invention is 66%. As a result, the color realization ratio of the OLED device according to the present invention is improved by about 4%.

This result is obtained when the transparent inorganic layer of silicon nitride ($SiN_x$) is formed with a thickness of 3000 Å between the transparent substrate and the transparent conductive layer. When the transparent inorganic layer is formed with different thicknesses and/or different materials in the respective sub-pixels to represent red and green colors, the total color realization ratio may be improved to more than 70%.

As described above, the OLED device according to an embodiment of the present invention has a transparent insulation layer or transparent semiconductor layer between the transparent substrate and the transparent conductive layer, with a thickness between 300 Å and 1 μm, in a single or multi-layered structure. With this construction, the OLED device can display images with an improved color realization ratio.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method for manufacturing an organic light emitting diode (OLED) device having a plurality of pixel regions, the method comprising:
   preparing a first substrate;
   forming a first electrode on the first substrate in the pixel region, the first electrode formed of a metal being reflective;
   forming an organic light-emitting layer on the first electrode;
   forming a second transparent electrode on the organic light-emitting layer, the second electrode formed of a transparent conductive material;
   forming a second transparent substrate on the second electrode; and forming a transparent layer on the second transparent electrode and the second transparent substrate, the transparent layer including an inorganic material or a semiconductor material.

2. The method according to claim 1, further comprising forming a thin film transistor, wherein the first electrode is electrically connected with the thin film transistor.

3. The method according to claim 1, wherein the inorganic material is one of silicon nitride and silicon oxide.

4. The method according to claim 1, wherein a thickness of the transparent layer is in a range between about 1500 Å and about 3500 Å.

5. The method according to claim 1, wherein the plurality of pixel regions include Red, Green, and Blue pixel regions, and wherein the transparent layer is formed in each of the Red, Green, and Blue pixel regions.

6. The method according to claim 5, wherein a thickness of the transparent layer in at least one of the Red, Green, and Blue pixel regions is different from that of the transparent layers in the other pixel regions.

7. The method according to claim 1, wherein the transparent layer is formed on an entire surface of the second transparent substrate.

8. The method according to claim 1, wherein the plurality of pixel regions include Red, Green, and Blue pixel regions, and wherein the transparent layer is formed in the Blue pixel regions.

9. The method according to claim 1, wherein the transparent layer modulates a wavelength-dependent characteristic of a blue light generated from the light-emitting layer.

* * * * *